(12) United States Patent
Yoon et al.

(10) Patent No.: US 8,933,867 B2
(45) Date of Patent: Jan. 13, 2015

(54) ORGANIC LIGHT-EMITTING SUBSTRATE, METHOD OF MANUFACTURING THE SAME, AND ORGANIC LIGHT-EMITTING DISPLAY DEVICE HAVING THE SAME

(75) Inventors: Young-Soo Yoon, Suwon-si (KR); Joon-Chul Goh, Hwaseong-si (KR); Chong-Chul Chai, Seoul (KR)

(73) Assignee: Samsung Display Co., Ltd. (KR)

( * ) Notice: Subject to any disclaimer, the term of this patent is extended or adjusted under 35 U.S.C. 154(b) by 874 days.

(21) Appl. No.: 12/388,463

(22) Filed: Feb. 18, 2009

(65) Prior Publication Data

US 2009/0262049 A1 Oct. 22, 2009

(30) Foreign Application Priority Data

Apr. 17, 2008 (KR) .................. 10-2008-0035425

(51) Int. Cl.
*G09G 3/30* (2006.01)
*H01L 27/32* (2006.01)

(52) U.S. Cl.
CPC ....... *H01L 27/3276* (2013.01); *H01L 2251/568* (2013.01)
USPC ............................................. 345/80; 345/76

(58) Field of Classification Search
CPC .......................... G02F 1/136259; G02F 1/1345
USPC ......... 345/76, 78, 92–94, 690; 438/29; 445/2; 313/504; 349/141
See application file for complete search history.

(56) References Cited

U.S. PATENT DOCUMENTS

| | | | |
|---|---|---|---|
| 7,777,698 B2 * | 8/2010 | Takahara et al. | 345/76 |
| 8,259,046 B2 * | 9/2012 | Tsubata | 345/87 |
| 2002/0171781 A1 * | 11/2002 | Kim | 349/43 |
| 2006/0279499 A1 * | 12/2006 | Park et al. | 345/92 |
| 2007/0007520 A1 * | 1/2007 | Seo | 257/48 |
| 2007/0159043 A1 * | 7/2007 | Kubota et al. | 313/110 |
| 2007/0290205 A1 * | 12/2007 | Chen et al. | 257/59 |
| 2008/0001869 A1 * | 1/2008 | Chung et al. | 345/87 |
| 2008/0157088 A1 * | 7/2008 | Chen et al. | 257/59 |

FOREIGN PATENT DOCUMENTS

| | | | |
|---|---|---|---|
| KR | 2002-0060461 | 7/2002 | |
| KR | 10-2002-0087738 | 11/2002 | |
| KR | 10-2006-0128445 | 12/2006 | |
| KR | 10-2007-0005965 | 1/2007 | |
| KR | 10-2007-0067930 | 6/2007 | |
| KR | 10-2007-0075294 | 7/2007 | |
| WO | WO2008007480 | * 1/2008 | .............. G09G 3/36 |

* cited by examiner

*Primary Examiner* — Quan-Zhen Wang
*Assistant Examiner* — Calvin C Ma
(74) *Attorney, Agent, or Firm* — Innovation Counsel LLP

(57) ABSTRACT

An organic light-emitting substrate includes a base substrate, a gate line, a data line, a bias line, an organic light-emitting diode, a switching transistor, a driving transistor and a repair line. The bias line is spaced apart from the gate line and the data line. The organic light-emitting diode includes a pixel electrode, a common electrode and an organic light-emitting part. The switching transistor is connected to the gate line and the data line. The driving transistor is connected to the bias line, the pixel electrode and the switching transistor. The repair line is formed from a pixel metal layer that is identical to the pixel electrode to be spaced apart from the pixel electrode, and is formed along the first direction to be overlapped with the gate line. Therefore, the repair line may repair electric defects of the gate line.

17 Claims, 6 Drawing Sheets

ORGANIC LIGHT-EMITTING SUBSTRATE, METHOD OF MANUFACTURING THE SAME, AND ORGANIC LIGHT-EMITTING DISPLAY DEVICE HAVING THE SAME

PRIORITY STATEMENT

This application claims priority under 35 U.S.C. §119 to Korean Patent Application No. 2008-35425, filed on Apr. 17, 2008 in the Korean Intellectual Property Office (KIPO), the contents of which are herein incorporated by reference in their entirety.

BACKGROUND

1. Technical Field

One or more embodiments of the present invention generally relate to an organic light-emitting substrate, a method of manufacturing the organic light-emitting substrate, and an organic light-emitting display device having the organic light-emitting substrate. More particularly, one or more embodiments of the present invention relate to an organic light-emitting substrate capable of repairing electric defects of a gate line a method of manufacturing the organic light-emitting substrate, and an organic light-emitting display device having the organic light-emitting substrate.

2. Description of the Related Art

Generally, an organic light-emitting display device includes an organic light-emitting substrate emitting light, an opposite substrate facing the organic light-emitting substrate and a sealing member formed interposed between the organic light-emitting substrate and the opposite substrate to seal the organic light-emitting substrate and the opposite substrate.

The organic light-emitting substrate includes a base substrate, an organic light-emitting diode and a driving circuit part electrically connected to the organic light-emitting diode to output driving current.

The driving circuit part includes a gate line, a data line, a bias line, a switching transistor and a driving transistor. The switching transistor is electrically connected to the gate line and the data line, and the driving transistor is electrically connected to the bias line, the organic light-emitting diode and the switching transistor.

The gate line is patterned from a gate metal layer formed on the base substrate. When the gate line is formed from the gate metal layer, electric defects such as a short, or an open, etc., may be generated in the gate line. Electric defects of the gate line may cause line defects in a display image of the organic light-emitting display device.

SUMMARY

One or more embodiments of the present invention provide an organic light-emitting substrate capable of repairing electric defects of a gate line.

One or more embodiments of the present invention also provide a method of manufacturing the above-mentioned organic light-emitting substrate.

One or more embodiments of the present invention also provide an organic light-emitting display device having the above-mentioned organic light-emitting substrate.

According to one or more embodiments of the present invention, an organic light-emitting substrate includes a base substrate, a gate line, a data line, a bias line, an organic light-emitting diode, a switching transistor, a driving transistor and a repair line. The gate line is formed on the base substrate along a first direction. The data line is formed along a second direction crossing the first direction. The bias line is spaced apart from the gate line and the data line. The organic light-emitting diode includes a pixel electrode formed on the base substrate, a common electrode formed on the pixel electrode, and an organic light-emitting part formed between the pixel electrode and the common electrode. The switching transistor is electrically connected to the gate line and the data line. The driving transistor is electrically connected to the bias line, the pixel electrode and the switching transistor. The repair line is formed from a pixel metal layer that is identical to the pixel electrode to be spaced apart from the pixel electrode, and is formed along the first direction to be overlapped with the gate line.

In accordance with an embodiment of the present invention, the pixel metal layer may include an optically transparent material. The organic light-emitting substrate may further include a transistor-covering part patterned from the pixel metal layer that is identical to the pixel electrode and the repair line to cover the switching transistor.

In accordance with an embodiment of the present invention, the transistor-covering part may be connected to the repair line. Alternatively, the transistor-covering part may be spaced apart from the repair line. Here, the transistor-covering part may be electrically connected to the pixel electrode.

In accordance with an embodiment of the present invention, a resistance of the pixel metal layer may be substantially equal to that of the gate line.

In accordance with an embodiment of the present invention, the gate line may include a gate line and a repair-protruding part. The gate line may be formed along the first direction. The repair-protruding part may protrude from the gate line to be overlapped with the repair line.

In accordance with an embodiment of the present invention, the common electrode may be formed to cover a whole surface of the base substrate. The organic light-emitting part may include a material emitting a white light.

In accordance with an embodiment of the present invention, the switching transistor may include a switching gate electrode, a switching active pattern, a switching source electrode and a switching drain electrode. The switching gate electrode may be electrically connected to the gate line. The switching active pattern may be formed on the switching gate electrode. The switching source electrode may be electrically connected to the data line to be overlapped with the switching active pattern. The switching drain electrode may be spaced apart from the switching source electrode to be overlapped with the switching active pattern.

In accordance with an embodiment of the present invention, the driving transistor may include a driving gate electrode, a driving active pattern, a driving source electrode and a driving drain electrode. The driving gate electrode may be electrically connected to the switching drain electrode. The driving active pattern may be formed on the driving gate electrode. The driving source electrode may be electrically connected to the bias line to be overlapped with the driving active pattern. The driving drain electrode may be spaced apart from the driving source electrode, and may be overlapped with the driving active pattern to be electrically connected to the pixel electrode.

According to one or more embodiments of the present invention, there is provided a method of manufacturing an organic light-emitting substrate. In the method, a gate line, a switching gate electrode and a driving gate electrode are formed on a base substrate. The gate line may extend along a first direction. The switching gate electrode may be electrically connected to the gate line. The driving gate electrode may be spaced apart from the switching gate electrode. Then, an active pattern is formed, which includes a switching active pattern disposed on the switching gate electrode, and a driving active pattern disposed on the driving gate electrode. Then, a data metal pattern is formed, which includes a data line formed along a second direction crossing the first direction, a bias line spaced apart from the gate line and the data line, a switching source electrode connected to the data line, a switching drain electrode spaced apart from the switching source electrode to be electrically connected to the driving gate electrode, a driving source electrode connected to the bias line and a driving drain electrode spaced apart from the driving source electrode. Then, a pixel metal pattern is formed, which includes a pixel electrode electrically connected to the driving drain electrode and a repair line spaced apart from the pixel electrode along the first direction to be overlapped with the gate electrode. Then, an organic light-emitting part is formed on the pixel electrode. A common electrode is then formed on the organic light-emitting part.

In accordance with an embodiment of the present invention, the pixel metal pattern may include an optically transparent material. The organic light-emitting substrate may further include a transistor-covering part patterned from the same pixel metal layer that is used to form to the pixel electrode and the repair line to cover the switching transistor. The transistor-covering part may be connected to the repair line.

According to one or more embodiments of the present invention, an organic light-emitting display device includes an organic light-emitting substrate and an opposite substrate. The organic light-emitting substrate emits light. The opposite substrate is disposed opposite to the organic light-emitting substrate to protect the organic light-emitting substrate. The organic light-emitting substrate includes a base substrate, a gate line, a data line, a bias line, an organic light-emitting diode, a switching transistor, a driving transistor and a repair line. The gate line is formed on the base substrate along a first direction. The data line is formed along a second direction crossing the first direction. The bias line is spaced apart from the gate line and the data line. The organic light-emitting diode includes a pixel electrode formed on the base substrate, a common electrode formed on the pixel electrode, and an organic light-emitting part formed between the pixel electrode and the common electrode. The switching transistor is electrically connected to the gate line and the data line. The driving transistor is electrically connected to the bias line, the pixel electrode and the switching transistor. The repair line is formed from a pixel metal layer that is identical to the pixel electrode to be spaced apart from the pixel electrode, and is formed along the first direction to be overlapped with the gate line.

In accordance with an embodiment of the present invention, the opposite substrate may include a color filter that is disposed at a position corresponding to the organic-light emitting diode. The organic light-emitting diode may emit white light.

In accordance with an embodiment of the present invention, the organic light-emitting substrate may further include a transistor-covering part that is patterned from the pixel metal layer that is identical to the pixel electrode and the repair line to cover the switching transistor.

According to one or more embodiments of the present invention, a repair line is patterned from a pixel metal layer identical to a pixel electrode to overlap with a gate line, so that the repair line may repair electric defects of the gate line. That is, when a laser beam is irradiated to an overlapping area of the gate line and the repair line, the repair line may play a role of a bypass line which is capable of repairing electric defects of the gate line.

BRIEF DESCRIPTION OF THE DRAWINGS

The above and other embodiments of the present invention will be described in detail with reference to the accompanying drawings, in which.

DETAILED DESCRIPTION

Figure 1:
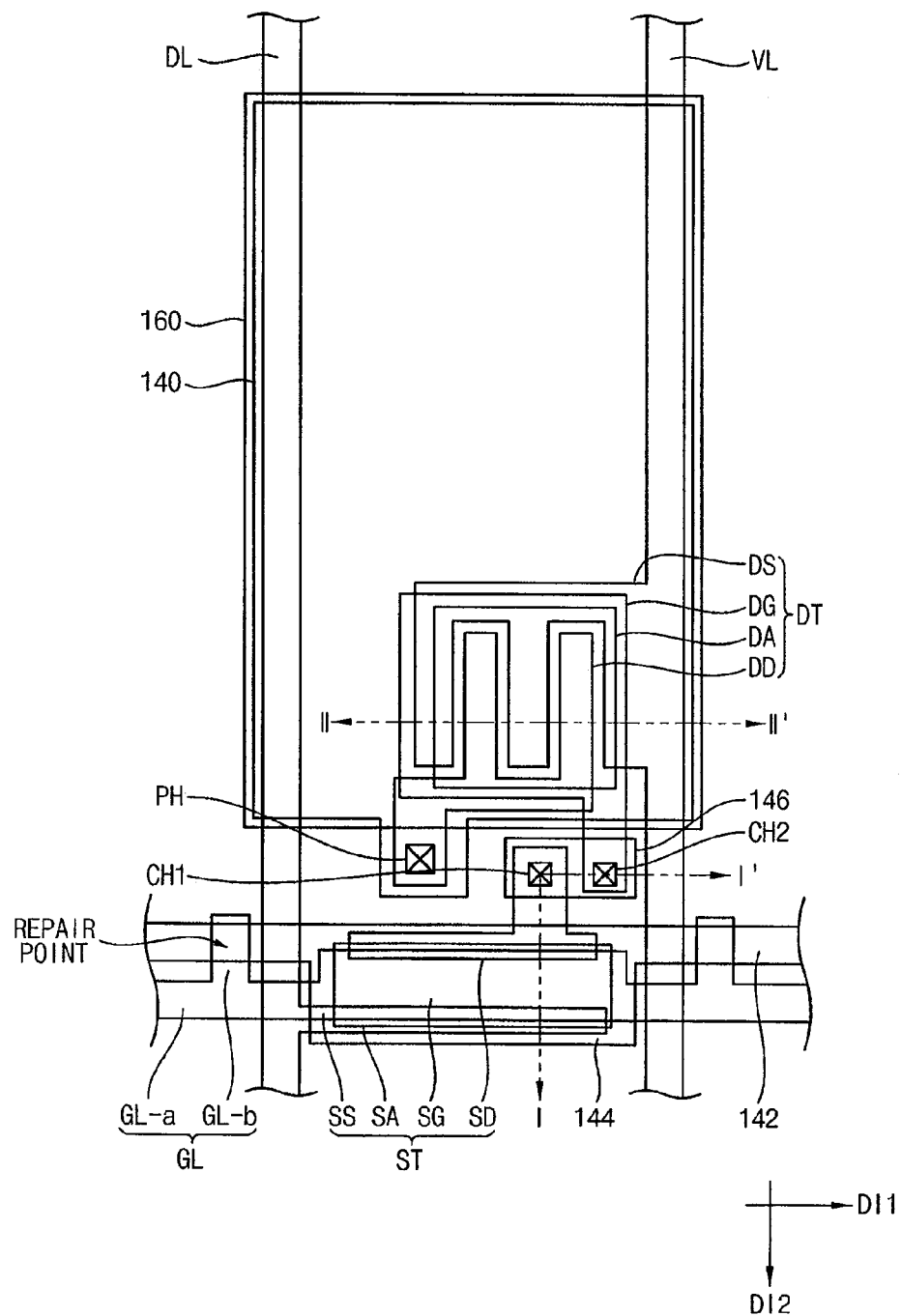
FIG. 1 is a plan view illustrating an organic light-emitting display device according to a first embodiment of the present invention.

The embodiments of the present invention are described more fully hereinafter with reference to the accompanying drawings, in which one or more embodiments of the present invention are shown. The present invention may, however, be embodied in many different forms and should not be construed as being limited to the embodiments set forth herein. Rather, these embodiments are provided so that this disclosure will be thorough and complete, and will fully convey the scope of the present invention to those skilled in the art. As such, the scope of the present invention will only be defined by the appended claims. In the drawings, the sizes and relative sizes of layers and regions may be exaggerated for clarity.

It will be understood that when an element or layer is referred to as being "on," "connected to" or "coupled to" another element or layer, it may be directly on, connected to or coupled to the other element or layer, or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be further understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary terms "below" or "beneath" may encompass both an orientation of above and below. The device may be otherwise oriented (rotated 90 degrees or at other orientations) and the spatially relative descriptors used herein may be interpreted accordingly.

The terminology used herein is for the purpose of describing particular embodiments of the present invention only and is not intended to be limiting of other embodiments of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-sectional illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as being limited to the particular shapes of the regions illustrated herein but are to include deviations in shapes that may result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as they are commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present invention will be explained in detail with reference to the accompanying drawings.

First Embodiment

Figure 2:
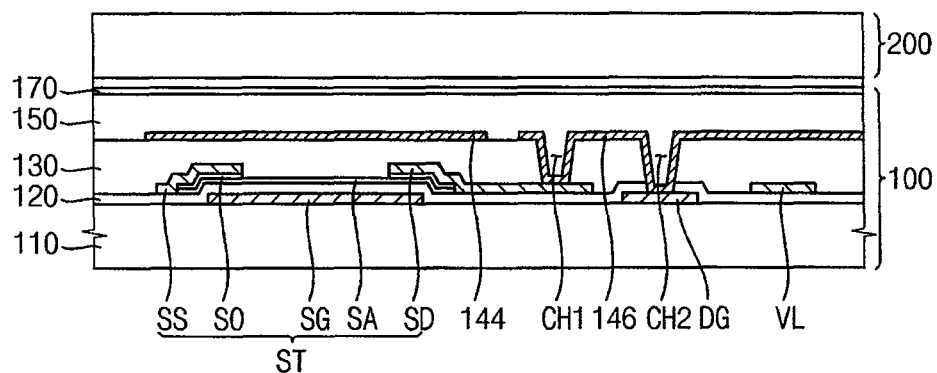
FIG. 2 is a cross-sectional view taken along a line I-I' of FIG. 1 according to one or more embodiments of the present invention.
Figure 3:
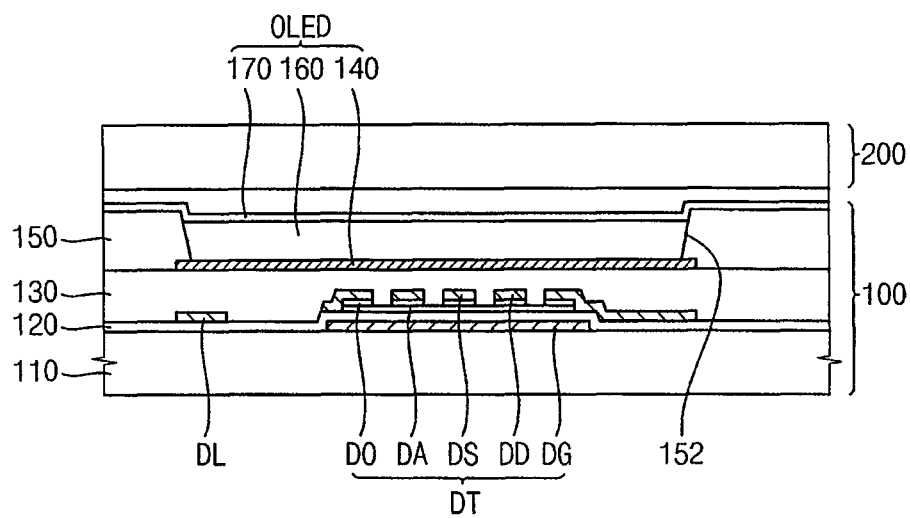
FIG. 3 is a cross-sectional view taken along a line II-II' of FIG. 1 according to one or more embodiments of the present invention.

FIG. 1 is a plan view illustrating an organic light-emitting display device according to a first embodiment of the present invention. FIG. 2 is a cross-sectional view taken along a line I-I' of FIG. 1 according to one or more embodiments of the present invention. FIG. 3 is a cross-sectional view taken along a line II-II' of FIG. 1 according to one or more embodiments of the present invention.

Referring to FIGS. 1 to 3, an organic light-emitting display device according to the first embodiment of the present invention may include an organic light-emitting substrate 100 emitting light and an opposite substrate 200 disposed opposite to the organic light-emitting substrate 100 to protect the organic light-emitting substrate 100.

The organic light-emitting display device may further include a sealing member (not shown) interposed between the organic light-emitting substrate 100 and the opposite substrate 200 to seal a space between the organic light-emitting substrate 100 and the opposite substrate 200. The sealing member may have characteristics such that air and humidity do not penetrate. For example, the sealing member may include frit glass.

The organic light-emitting substrate 100 may include a base substrate 110, a gate line GL, a gate insulation layer 120, a data line DL, a bias line VL, a switching transistor ST, a driving transistor DT, a protection layer 130, an organic light-emitting diode OLED, a repair line 142, a transistor-covering part 144, a connection electrode 146 and an organic insulation layer 150. Here, the organic light-emitting diode OLED may include a pixel electrode 140, an organic light-emitting part 160 and a common electrode 170.

The base substrate 110 may have a plate shape. The base substrate 110 may include a transparent material such as glass, quarts, synthetic resin, etc. The base substrate 110 may include a display area including a plurality of unit pixels in order to display images and a peripheral area of the display area.

The gate line GL is formed on the base substrate 110 to extend along a first direction DI1. The gate line GL may include, for example, a gate line GL-a, and a repair-protruding part GL-b. The gate line GL-a may extend along the first direction DI1, and the repair-protruding part GL-b may protrude from the gate line GL-a in a perpendicular direction with respect to the first direction DI1.

The gate insulation layer 120 is formed on the base substrate 110 to cover the gate line GL. The gate insulation layer 120 may include an inorganic material. For example, the gate insulation layer 120 may include a silicon nitride (SiNx) layer and a silicon oxide (SiOx) layer.

The data line DL is formed on the gate insulation layer 120, and may extend along a second direction DI2 crossing the first direction DI1. The first direction DI1 and the second direction DI2 may be orthogonal with each other.

The bias line VL is formed on the gate insulation layer 120, and is spaced apart from the data line DL. For example, the bias line VL may be substantially in parallel with the data line DL.

The switching transistor ST includes a switching gate electrode SG, a switching active pattern SA, a switching ohmic contact pattern SO, a switching source electrode SS and a switching drain electrode SD.

The switching gate electrode SG is electrically connected to the gate line GL to be covered by the gate insulation layer 120. The switching active pattern SA is formed on the gate insulation layer 120 to be overlapped with the switching gate electrode SG. The switching ohmic contact pattern SO is formed on the switching active pattern SA. The switching ohmic contact pattern SO includes a first pattern portion and a second pattern portion that are spaced apart from each other. The switching source electrode SS is electrically connected to the data line DL, and is formed on the first pattern portion of the switching ohmic contact pattern SO. The switching drain electrode SD is spaced apart from the switching source electrode SS, and is formed on the second pattern portion of the switching ohmic contact pattern SO. In this embodiment, the switching source electrode SS and the switching drain electrode SD may be extended in the first direction DI1 that is substantially in parallel with the gate line GL.

The driving transistor DT includes a driving gate electrode DG, a driving active pattern DA, a driving ohmic contact pattern DO, a driving source electrode DS and a driving drain electrode DD.

The driving gate electrode DG is formed on the base substrate 110 to be covered by the gate insulation layer 120. The driving active pattern DA is formed on the gate insulation layer 120 to overlap with the driving gate electrode DG. The driving ohmic contact pattern DO is formed on the driving active pattern DA. The driving ohmic contact pattern DO may include a first pattern portion and a second pattern portion that are spaced apart from each other. The driving source electrode DS is electrically connected to the bias line VL, and is formed on the first pattern portion of the driving ohmic contract pattern DO. The driving drain electrode DD is spaced apart from the driving source electrode DS, and is formed on the second pattern portion of the driving ohmic contact pattern DO. In this embodiment, the driving source electrode DS may have an U-shape or two U-shapes when viewed on a plan view. The driving drain electrode DD may be formed between the U-shape of the driving source electrode DS. Thus, a channel width, which is formed between the driving source electrode DS and the driving drain electrode DD, may be increased.

The protection layer 130 is formed on the gate insulation layer 120 to cover the data line DL, the bias line VL, the switching transistor ST and the driving transistor DT. The protection layer 130 may include an organic material or an inorganic material.

A first connection contact hole CH1 exposing a portion of the switching drain electrode SD is formed through the protection layer 130, a second connection contact hole CH2 exposing a portion of the driving gate electrode DG is formed through the protection layer 130, and a pixel contact hole PH exposing a portion of the driving drain electrode DD is formed though the protection layer 130. Alternatively, a gate contact hole may be formed through the gate insulation layer 120 at a position corresponding to the second connection contact hole CH2. Thus, the second connection contact hole CH2 and the gate contact hole may expose a portion of the driving gate electrode DG.

The pixel electrode 140 is formed on the protection layer 130, and is disposed at each of the unit pixels. The pixel electrode 140 electrically contacts with the driving drain electrode DD through the pixel contact hole PH. The pixel electrode 140 may have an optically non-transparent and electrically conductive material. For example, the pixel electrode 140 may have a property which is capable of reflecting light.

The repair line 142 is formed on the protection layer 130, and may extend along the first direction DI1 to be overlapped with the gate line GL. For example, the repair line 142 may be overlapped with the repair-protruding part GL-b of the gate line GL.

The transistor-covering part 144 is formed on the protection layer 130 to cover the switching transistor ST. The transistor-covering part 144 may be connected to the repair line 142. That is, the transistor-covering part 144 may protrude from the repair line 142 toward the gate line GL.

The connection electrode 146 is formed on the protection layer 130 to be overlapped with the switching drain electrode SD and the driving gate electrode DG. The connection electrode 146 electrically contacts with the switching drain electrode SD through the first connection contact hole CH1, and electrically contacts with the driving gate electrode DG through the second connection contact hole CH2 and the gate contact hole. As a result, the connection electrode 146 may electrically connect to the switching drain electrode SD and the driving gate electrode DG.

The repair line 142, the transistor-covering part 144 and the connection electrode 146 may have the same material as the pixel electrode 140. That is, the repair line 142, the transistor-covering part 144 and the connection electrode 146 may have an optically non-transparent and electrically conductive material. A resistance of the optically non-transparent and electrically conductive material may be substantially equal to or greater than that of the gate line GL. Alternatively, the resistance of the optically non-transparent and electrically conductive material may be substantially smaller than that of the gate line GL. For example, the resistance of the optically non-transparent and electrically conductive material may be about 0.15-Ohms per square ($\Omega/\square$), and the resistance of the gate line GL may be about 0.11-Ohms per square ($\Omega/\square$).

In this embodiment, the connection electrode 146 may be omitted. When the connection electrode 146 is omitted, the switching drain electrode SD may directly and electrically contact with the driving gate electrode DG through the gate contact hole formed through the gate insulation layer 120.

The organic insulation layer 150 is formed on the protection layer 130 to cover the repair line 142, the transistor-covering part 144 and the connection electrode 146. The organic insulation layer 150 may have a light-emitting groove 152 formed therethrough to expose the pixel electrode 140. The organic insulation layer 150 may include a transparent organic material. Alternatively, the organic insulation layer 150 may include an organic black matrix which is capable of blocking light. For example, the organic insulation layer 150 may include carbon black which is capable of absorbing light.

The organic light-emitting part 160 is formed on the pixel electrode 140. That is, the organic light-emitting part 160 is formed within the light-emitting groove 152 of the organic insulation layer 150 to cover the pixel electrode 140. The organic light-emitting part 160 may cover an edge portion of the organic insulation layer 150 adjacent to the light-emitting groove 152.

The organic light-emitting part 160 may emit white light. For example, the organic light-emitting part 160 may include a red light-emitting material emitting red color light, a green light-emitting material emitting green color light and a blue light-emitting material emitting blue color light. The red color light, the green color light and the blue color light are mixed to generate the white light. The red, green and blue light-emitting materials may be mixed or deposited to each other to form the organic light-emitting part 160. Alternatively, the organic light-emitting part 160 may include a white light-emitting material which emits white light.

Alternatively, the organic light-emitting part 160 may generate one of red color light, green color light or blue color light. That is, the organic light-emitting part 160 may include one of the red color light-emitting material, the green color light-emitting material or the blue color light-emitting material.

The common electrode 170 is formed on the organic insulation layer 150 and the organic light-emitting part 160 to cover a whole area of the display area. The common electrode 170 may include an optically transparent and electrically conductive material. The common electrode 170 may transmit a common voltage. For example, a magnesium and aluminum alloy may be deposited to form the common electrode 170. The common electrode 170 may have a thickness of no more than about 100 Å in order to transmit light.

The common electrode 170 may have a transparent property and the pixel electrode 140 may have a non-transparent property, such that the organic light-emitting substrate 100 may be an organic light-emitting substrate of a top emission type, which excites light toward an upper position of the base substrate 110.

Figure 4:
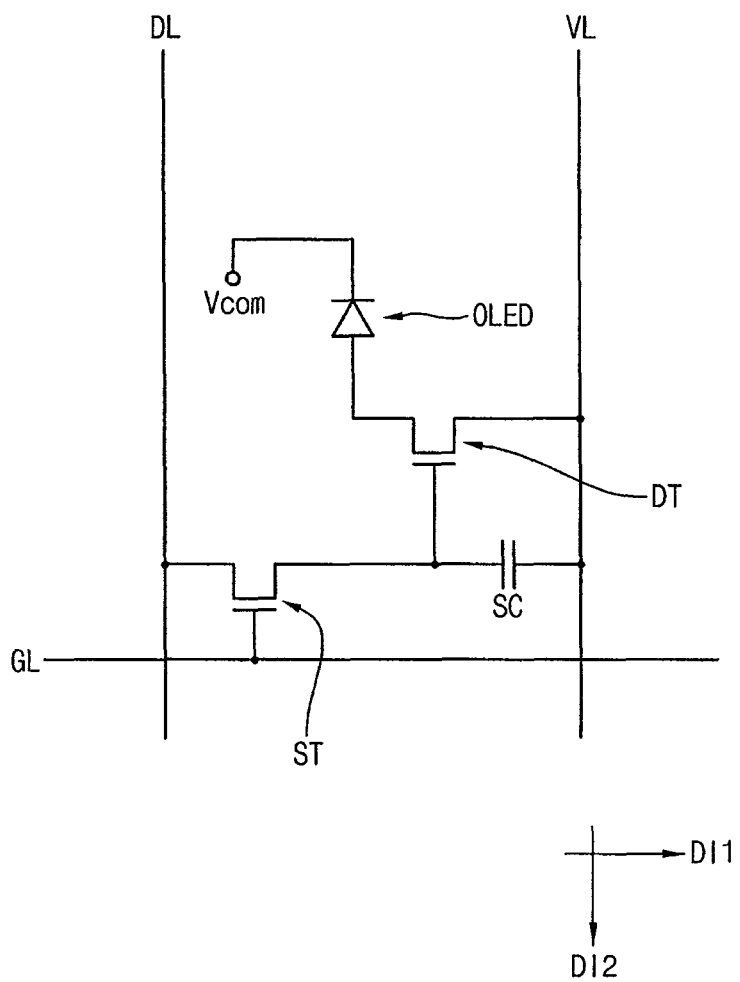
FIG. 4 is a circuit diagram schematically showing an organic light-emitting display device of FIG. 1 according to one or more embodiments of the present invention.

FIG. 4 is a circuit diagram schematically showing an organic light-emitting display device of FIG. 1 according to one or more embodiments of the present invention.

Referring to FIG. 4, the gate line GL extends along the first direction DI1. The data line DL extends along the second direction DI2. The bias line VL is spaced apart from the data line DL to extend along the second direction DI2.

The switching transistor ST is electrically connected to the gate line GL, the data line DL and a driving gate electrode of the driving transistor DT. The driving transistor DT is electrically connected to a switching drain electrode of the switching transistor ST, the bias line VL and a pixel electrode of the organic light-emitting diode (OLED). A common electrode of the OLED receives a common voltage Vcom. A storage capacitor SC is formed between the driving gate electrode of the driving transistor DT and the bias line VL.

Driving of the OLED will be briefly explained. When a gate signal is applied to the gate line GL so that the switching transistor ST is turned on, a data signal transmitted along the data line DL turns on the driving transistor DT. The data signal is stored in the storage capacitor SC so that the driving transistor DT is turned on for one frame. As a result, driving current for driving the OLED is applied to the OLED through the bias line VL, so that the OLED emits light.

Hereinafter, a method of manufacturing the organic light-emitting substrate 100 will be described with reference to FIGS. 1 to 3.

Referring again to FIGS. 1 to 3, a gate metal layer is formed on the base substrate 110, and then the gate metal layer is patterned to form a gate metal pattern including the gate line GL, the switching gate electrode SG and the driving gate electrode DG.

The gate line GL extends along the first direction DI1 on the base substrate 110, and the switching gate electrode SG is connected to the gate line GL. The driving gate electrode DG is spaced apart from the switching gate electrode SG and is formed on the base substrate 110. The gate line GL may include, for example, the gate line GL-a extending along the first direction DI1 and a repair-protruding part GL-b protruding from the gate line GL-a.

Then, the gate insulation layer 120 is formed on the base substrate 110 to cover the gate metal pattern. The gate contact hole for exposing a portion of the driving gate electrode DG may be formed through the gate insulation layer 120.

Then, an active layer and an ohmic contact layer are deposited on the gate insulation layer 120, and then the active layer and the ohmic contact layer are patterned to form an active pattern and an ohmic contact pattern. Here, the active pattern includes the switching active pattern SA disposed on the switching gate electrode SG and the driving active pattern DA disposed on the driving gate electrode DG.

Then, a data metal layer is formed on the gate insulation layer 120 to cover the active pattern and the ohmic contact pattern, and the data metal layer is patterned to form a data metal pattern. Here, the data metal pattern includes the data line DL, the bias line VL, the switching source electrode SS, the switching drain electrode SD, the driving source electrode DS and the driving drain electrode DD.

The ohmic contact pattern is then again patterned by using the switching source electrode SS, the switching drain electrode SD, the driving source electrode DS and the driving drain electrode DD. As a result, the switching ohmic contact pattern SO and the driving ohmic contact pattern DO are formed.

Then, the protection layer 130 is formed on the gate insulation layer 120 to cover the data metal pattern, and a portion of the protection layer 130 is removed to form the pixel contact hole PH, and the first and second connection contact holes CH1 and CH2.

The pixel contact hole PH exposes a portion of the driving drain electrode DD, and the first connection contact hole CH1 exposes a portion of the switching drain electrode SD. The second connection contact hole CH2 exposes a portion of the driving gate electrode DG exposed by the gate contact hole. In this embodiment, the gate contact hole formed through the gate insulation layer 120 may be formed when the second connection contact hole CH2 is formed.

A pixel metal layer is then formed on the protection layer 130, and the pixel metal layer is patterned to form a pixel metal pattern including the pixel electrode 140, the repair line 142, the transistor-covering part 144 and the connection electrode 146.

The pixel electrode 140 is formed on the unit pixel, and the repair line 142 is formed along the first direction DI1 to be overlapped with the gate line GL. The transistor-covering part 144 covers the switching transistor ST, and the connection electrode 146 is electrically connected to the switching drain electrode SD and the driving gate electrode DG through the first and second connection contact holes CH1 and CH2 and the gate contact hole. The repair line 142 may be overlapped with a repair-protruding part GL-b of the gate line GL. The transistor-covering part 144 may be connected to the repair line 142.

A resistance of the pixel metal pattern may be substantially equal to or greater than that of the gate metal pattern. The pixel metal pattern may include an optically non-transparent and electrically conductive material. Furthermore, the pixel metal pattern may have light-reflecting property.

Then, an organic insulation layer 150 is formed to cover the pixel metal pattern, and a portion of the organic insulation layer 150 is removed to form the light-emitting groove 152. The light-emitting groove 152 exposes the pixel electrode 140.

Then, the organic light-emitting part 160 is formed on the pixel electrode 140. That is, the organic light-emitting part 160 is formed within the light-emitting groove 152. For example, an organic light-emitting material may be deposited through a shadow mask to form the organic light-emitting part 160.

Then, the common electrode 170 is formed on the organic light-emitting part 160 and the organic insulation layer 150. The common electrode 170 may be formed on a whole area of the display area.

According to the present embodiment, the repair line 142 is overlapped with a repair-protruding part GL-b of the gate line GL, so that the repair line 142 may repair electric defects of the gate line GL.

When a laser beam is irradiated to an overlapping area between the repair-protruding part GL-b and the repair line 142, the laser beam forms a repair hole through the protection layer 130 and the gate insulation layer 120. Thus, the repair line 142 may be electrically connected to the repair-protruding part GL-b through the repair hole. That is, the repair line 142 may play a role of a bypass line which is capable of repairing electric defects of the gate line GL.

Second Embodiment

Figure 5:
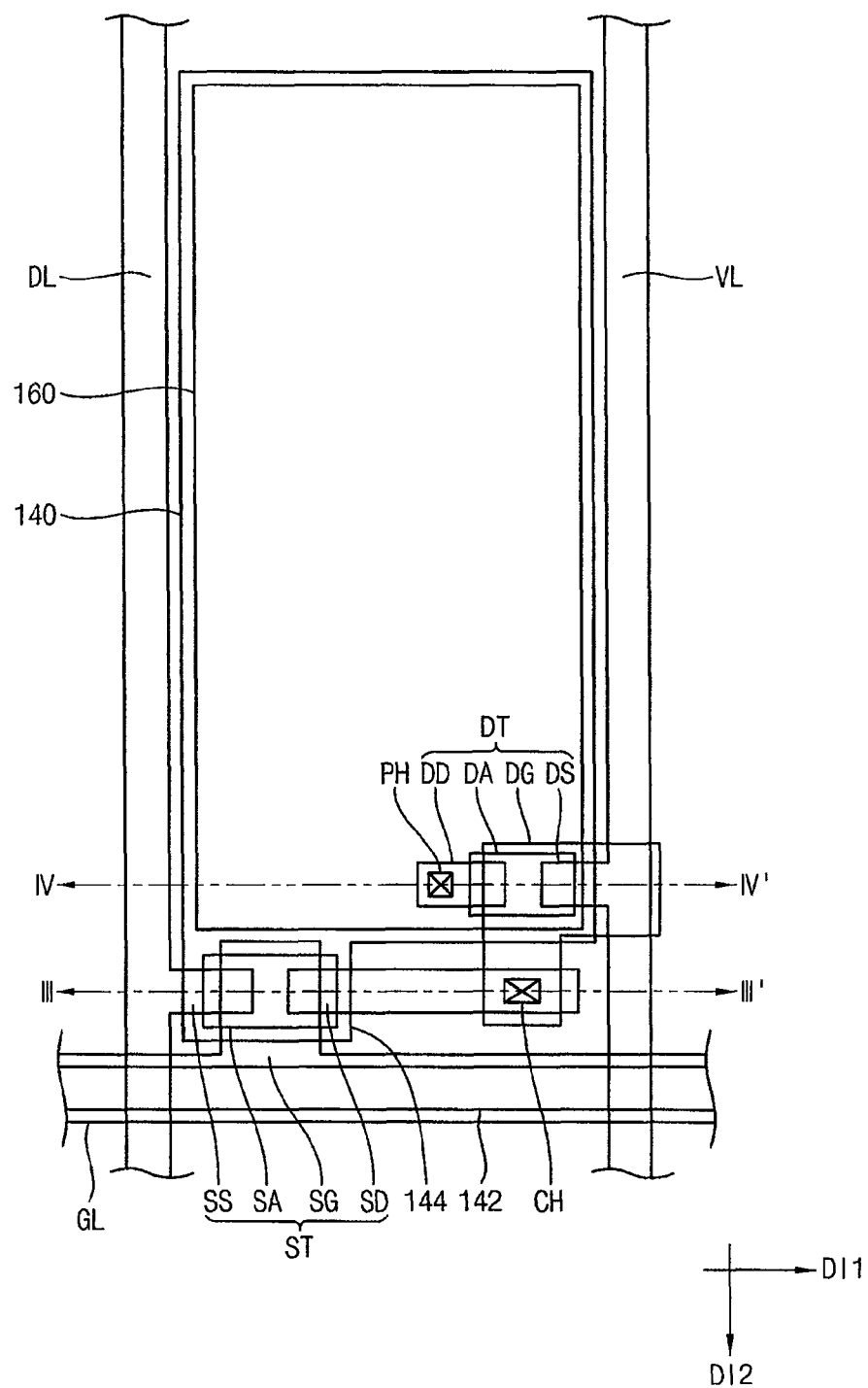
FIG. 5 is a plan view illustrating an organic light-emitting display device according to a second embodiment of the present invention.
Figure 6:
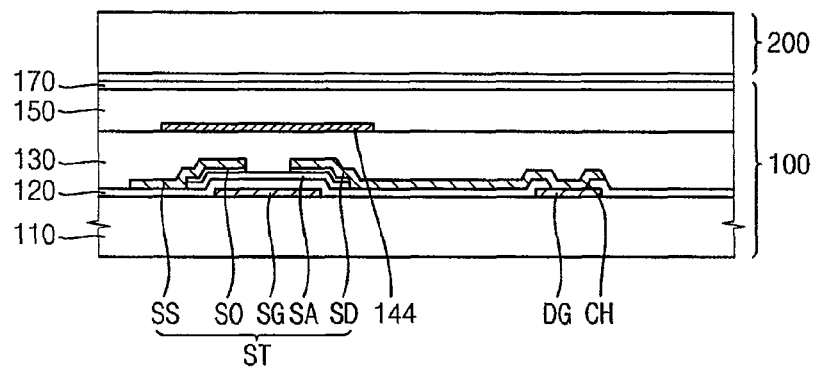
FIG. 6 is a cross-sectional view taken along a line III-III' of FIG. 5 according to one or more embodiments of the present invention.
Figure 7:
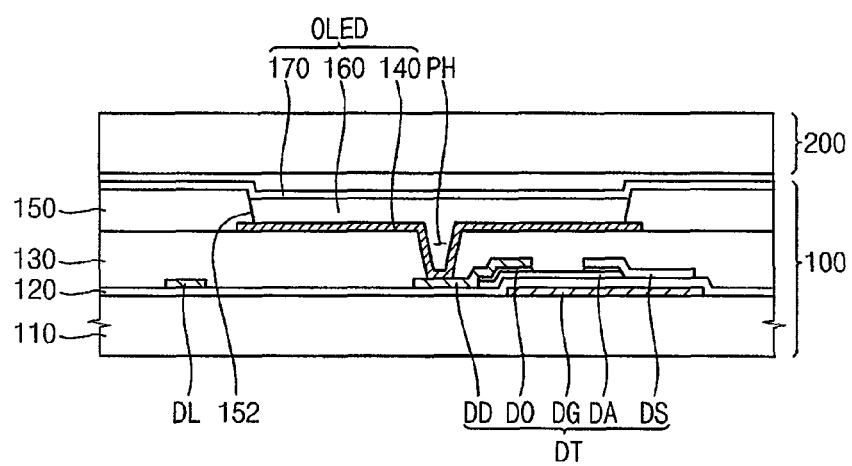
FIG. 7 is a cross-sectional view taken along a line IV-IV' of FIG. 5 according to one or more embodiments of the present invention.

FIG. 5 is a plan view illustrating an organic light-emitting display device according to a second embodiment of the present invention. FIG. 6 is a cross-sectional view taken along a line III-III' of FIG. 5 according to one or more embodiments of the present invention. FIG. 7 is a cross-sectional view taken along a line IV-IV' of FIG. 5 according to one or more embodiments of the present invention.

Referring to FIGS. 5 to 7, an organic light-emitting display device according to the second embodiment of the present invention may include an organic light-emitting substrate 100 emitting light and an opposite substrate 200 disposed opposite to the organic light-emitting substrate 100 to protect the organic light-emitting substrate 100.

The organic light-emitting display device may further include a sealing member (not shown) interposed between the organic light-emitting substrate 100 and the opposite substrate 200 to seal a space between the organic light-emitting substrate 100 and the opposite substrate 200.

The organic light-emitting substrate 100 may include a base substrate 110, a gate line GL, a gate insulation layer 120, a data line DL, a bias line VL, a switching transistor ST, a driving transistor DT, a protection layer 130, an organic light-emitting diode OLED, a repair line 142, a transistor-covering part 144 and an organic insulation layer 150. Here, the organic light-emitting diode OLED may include a pixel electrode 140, an organic light-emitting part 160 and a common electrode 170.

The base substrate 110 may have a plate shape. The base substrate 110 may have a transparent property. The base substrate 110 may include a display area including a plurality of unit pixels in order to display images and a peripheral area of the display area. The gate line GL is formed on the base substrate 110 to extend along a first direction DI1. The gate insulation layer 120 is formed on the base substrate 110 to cover the gate line GL. The data line DL is formed on the gate insulation layer 120 to extend along a second direction DI2 crossing the first direction DI1. The first direction DI1 and the second direction DI2 may be orthogonal with each other. The bias line VL is formed on the gate insulation layer 120, and is spaced apart from the data line DL.

The switching transistor ST includes a switching gate electrode SG, a switching active pattern SA, a switching ohmic contact pattern SO, a switching source electrode SS and a switching drain electrode SD. Here, the switching transistor ST is substantially the same as the switching transistor ST in accordance with the first embodiment of the present invention, as described in FIGS. 1 to 3, except for their detailed shape and position; thus, a detailed description thereof will be omitted.

The driving transistor DT includes a driving gate electrode DG, a driving active pattern DA, a driving ohmic contact pattern DO, a driving source electrode DS and a driving drain electrode DD. Here, the driving transistor DT is substantially the same as the driving transistor DT in accordance with the first embodiment of the present invention, as described in FIGS. 1 to 3, except for their detailed shape and position; thus, a detailed description thereof will be similarly omitted.

The switching drain electrode SD is extended to be overlapped with the driving gate electrode DG, and is electrically connected to the driving gate electrode DG by a connection contact hole CH formed through the gate insulation layer 120.

The protection layer 130 is formed on the gate insulation layer 120 to cover the data line DL, the bias line VL, the switching transistor ST and the driving transistor DT. A pixel contact hole PH may be formed through the protection layer 130 to expose a portion of the driving drain electrode DD.

The pixel electrode 140 is formed on the protection layer 130, and is disposed at each of the unit pixels. The pixel electrode 140 electrically contacts with the driving drain electrode DD through the pixel contact hole PH. The pixel electrode 140 may have an optically non-transparent and electrically conductive material. For example, the pixel electrode 140 may have a property which is capable of reflecting light.

The repair line 142 is formed on the protection layer 130, and may extend along the first direction DI1 to be overlapped with the gate line GL. For example, the repair line 142 may be formed along the gate line GL to be overlapped with the gate line GL.

The transistor-covering part 144 is formed on the protection layer 130 to cover the switching transistor ST. The transistor-covering part 144 may be spaced apart from the repair line 142. Alternatively, the transistor-covering part 144 may be connected to the pixel electrode 140. When the transistor-covering part 144 is connected to the pixel electrode 140, the transistor-covering part 144 is prevented from being floated.

The repair line 142 and the transistor-covering part 144 may have the same material as the pixel electrode 140. That is, the repair line 142 and the transistor-covering part 144 may have an optically non-transparent and electrically conductive material. A resistance of the optically non-transparent and electrically conductive material may be substantially equal to or greater than that of the gate line GL. Alternatively, the resistance of the optically non-transparent and electrically conductive material may be substantially smaller than that of the gate line GL.

The organic insulation layer 150 is formed on the protection layer 130 to cover the repair line 142 and the transistor-covering part 144. The organic insulation layer 150 may have a light-emitting groove 152 formed therethrough to expose the pixel electrode 140. The organic insulation layer 150 may include a transparent organic material. Alternatively, the organic insulation layer 150 may include an organic black matrix which is capable of blocking light.

The organic light-emitting part 160 is formed on the pixel electrode 140. That is, the organic light-emitting part 160 is formed within the light-emitting groove 152 of the organic insulation layer 150 to cover the pixel electrode 140. The organic light-emitting part 160 may emit white light. Alternatively, the organic light-emitting part 160 may generate one of red color light, green color light or blue color light.

The common electrode 170 is formed on the organic insulation layer 150 and the organic light-emitting part 160 to cover a whole area of the display area. The common electrode 170 may include an optically transparent and electrically conductive material. The common electrode 170 may transmit a common voltage. The common electrode 170 may have a thickness of no more than about 100 Å in order to transmit light.

A circuit diagram schematically showing an organic light-emitting display device in accordance with the present embodiment is substantially the same as the circuit diagram schematically showing an organic light-emitting display device in accordance with the first embodiment of the present invention as described in FIG. 4; thus, a detailed description thereof will be omitted.

Figure 8:
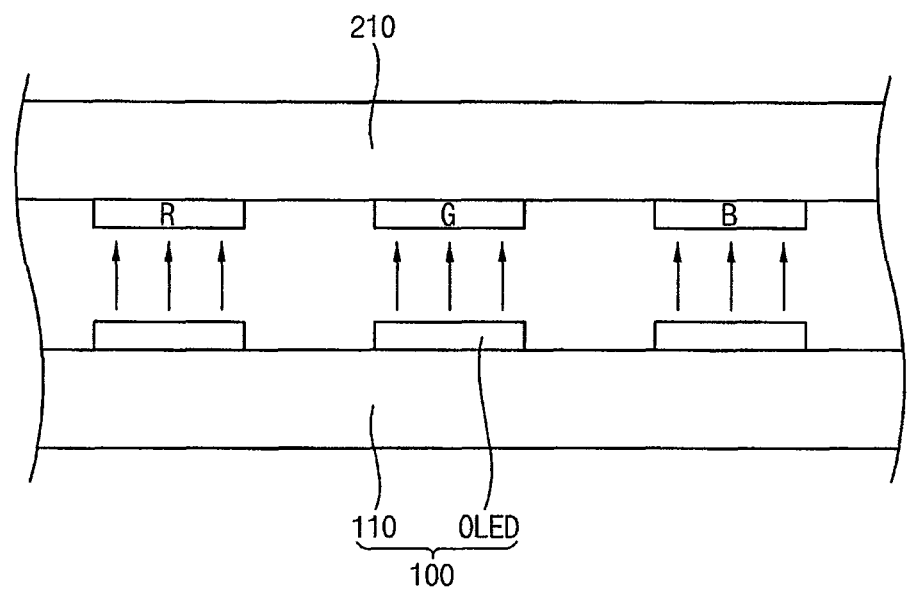
FIG. 8 is a cross-sectional view schematically showing an organic light-emitting display device of FIG. 5 according to one or more embodiments of the present invention.

FIG. 8 is a cross-sectional view schematically showing an organic light-emitting display device of FIG. 5 according to one or more embodiments of the present invention.

Referring to FIG. 8, when the organic light-emitting part 160 emits white light, the opposite substrate 200 may include a protection substrate 210 and a plurality of color filters CF that is formed on the protection substrate 210.

The protection substrate 210 is disposed to face the organic light-emitting substrate 100 to protect the organic light-emitting diodes OLED. The protection substrate 210 may have a plate shape that is identical to that of the base substrate 110, and may have an optically transparent property.

The color filters CF are formed on a first surface of the protection substrate 210 facing the organic light-emitting substrate 100, and are disposed in a position corresponding to the OLED. The color filters CF may include red color filters R, green color filters G and blue color filters B. Here, white light generated from the OLED is transmitted through the color filters CF to display an image.

The organic light-emitting diodes OLED may be self-emissive to emit red color light, green color light and blue color light to display an image. When the organic light-emitting diodes OLED self-emit the red, green and blue color lights, the color filters CF may be omitted from the opposite substrate 200.

In this embodiment, the opposite substrate 200 includes the color filters CF. Alternatively, the organic light-emitting substrate 100 may also include the color filters CF.

Hereinafter, a method of manufacturing the organic light-emitting substrate 100 will be described with reference to FIGS. 5 to 7.

Referring again to FIGS. 5 to 7, a gate metal layer is formed on the base substrate 110, and then the gate metal layer is patterned to form a gate metal pattern including the gate line GL, the switching gate electrode SG and the driving gate electrode DG. The gate line GL extends along the first direction DI1 on the base substrate 110, and the switching gate electrode SG is connected to the gate line GL. The driving gate electrode DG is spaced apart from the switching gate electrode SG.

Then, the gate insulation layer 120 is formed on the base substrate 110 to cover the gate metal pattern. The connection contact hole CH for exposing a portion of the driving gate electrode DG may be formed through the gate insulation layer 120.

Then, an active layer and an ohmic contact layer are deposited on the gate insulation layer 120, and then the active layer and the ohmic contact layer are patterned to form an active pattern and an ohmic contact pattern. Here, the active pattern includes the switching active pattern SA and the driving active pattern DA.

Then, a data metal layer is formed on the gate insulation layer 120 to cover the active pattern and the ohmic contact pattern, and the data metal layer is patterned to form a data metal pattern. Here, the data metal pattern includes the data line DL, the bias line VL, the switching source electrode SS, the switching drain electrode SD, the driving source electrode DS and the driving drain electrode DD. The switching drain electrode SD electrically connects to the driving gate electrode DG through the connection contact hole CH.

Then, the ohmic contact pattern is again patterned by using the switching source electrode SS, the switching drain electrode SD, the driving source electrode DS and the driving drain electrode DD. As a result, the switching ohmic contact pattern SO and the driving ohmic contact pattern DO are formed.

Then, the protection layer 130 is formed on the gate insulation layer 120 to cover the data metal pattern, and a portion of the protection layer 130 is removed to form the pixel contact hole PH.

Then, a pixel metal layer is formed on the protection layer 130, and the pixel metal layer is patterned to form a pixel metal pattern including the pixel electrode 140, the repair line 142 and the transistor-covering part 144. A resistance of the pixel metal pattern may be substantially equal to or greater than that of the gate metal pattern. The pixel metal pattern may include an optically non-transparent and electrically conductive material. Furthermore, the pixel metal pattern may have light-reflecting property.

The pixel electrode 140 is formed on the unit pixel, and the repair line 142 is formed on the gate line GL along the first direction DI1. The transistor-covering part 144 covers the switching transistor ST. The transistor-covering part 144 may be spaced apart from the repair line 142 and may be electrically connected to the pixel electrode 140.

Then, an organic insulation layer 150 is formed to cover the pixel metal pattern, and a portion of the organic insulation layer 150 is removed to form the light-emitting groove 152. The light-emitting groove 152 may expose the pixel electrode 140.

Then, the organic light-emitting part 160 is formed on the pixel electrode 140. That is, the organic light-emitting part 160 is formed within the light-emitting groove 152.

Then, the common electrode 170 is formed on the organic light-emitting part 160 and the organic insulation layer 150. The common electrode 170 may be formed on a whole area of the display area.

According to one or more embodiments of the present invention, as the repair line 142 is formed on an upper portion of the gate line GL along the gate line GL, the repair line 142 may repair electric defects of the gate line GL. When a laser beam is irradiated to the repair line 142, the laser beam forms a repair hole through the protection layer 130 and the gate insulation layer 120. Thus, the repair line 142 may be electrically connected to the gate line GL through the repair hole. That is, the repair line 142 may play a role of a bypass line which is capable of repairing electric defects of the gate line GL.

As described above, according to one or more embodiments of the present invention, the repair line 142, which is patterned from the same pixel metal layer as that for the pixel electrode 140 of the organic light-emitting diode OLED, is disposed on the gate line GL to be overlapped with the gate line GL. As a result, when electric defects such as an opening defect or a short defect are generated in the gate line GL, laser beam may be irradiated at an overlapping area between the gate line GL and the repair line 142, so that electric defects of the gate line GL may be repaired.

For example, when the electric defect of the gate line GL is opening defect, the laser beam may be irradiated to two positions of the repair line 142 corresponding to the opening defect, so that the repair line 142 and the gate line GL may be electrically connected to each other at the two positions to bypass the opening defect. When the electric defect of the gate line GL is short defect, the laser beam may be irradiated to two edge portions of the gate line GL corresponding to the shorted position to open the gate line GL. Then, the laser beam may be irradiated to the repair line 142 corresponding to positions surrounding the two opened edge portions of the gate line GL, so that the repair line 142 and the gate line GL may be electrically connected to each other at those positions to bypass the short defect. As a result, even though electric defects are generated in the gate line, the repair line 142 may play a role of a bypass line which is capable of repairing electric defects of the gate line GL.

Although exemplary embodiments of the present invention have been described, it is understood that embodiments of the present invention should not be limited to these exemplary embodiments, but many modifications in form and detail may be made by one of ordinary skill in the art without departing from the spirit and scope of the present invention. Accordingly, all such modifications are intended to be included within the scope of the present invention as defined in the following claims.

What is claimed is:

1. An organic light-emitting substrate comprising:
a base substrate;
a gate line formed on the base substrate along a first direction;
a data line formed along a second direction crossing the first direction;
a bias line spaced apart from the gate line and the data line;
an organic light-emitting diode comprising a pixel electrode formed on the base substrate, a common electrode formed on the pixel electrode, and an organic light-emitting part formed between the pixel electrode and the common electrode;
a switching transistor electrically connected to the gate line and the data line;
a driving transistor electrically connected to the bias line, the pixel electrode and the switching transistor;
a repair line formed of a same material and formed in a same plane as the pixel electrode and insulated from the pixel electrode, the repair line extending along the first direction; and
a transistor-covering part patterned from the pixel metal layer that is used to form the pixel electrode and the repair line to cover the switching transistor, the transistor-covering part and the repair line being formed in one piece, and overlapping a gate electrode of the switching transistor,
wherein the gate line and the transistor-covering part overlap a channel region which extends between a source region and a drain region of the switching transistor.

2. The organic light-emitting substrate of claim 1, wherein the pixel metal layer comprises an optically transparent material.

3. The organic light-emitting substrate of claim 2, wherein a resistance of the pixel metal layer is substantially equal to that of the gate line.

4. The organic light-emitting substrate of claim 1, wherein the transistor-covering part is spaced apart from the repair line.

5. The organic light-emitting substrate of claim 4, wherein the transistor-covering part is electrically connected to the pixel electrode.

6. The organic light-emitting substrate of claim 1, wherein the gate line comprises:
a gate line formed along the first direction; and
a repair-protruding part protruding from the gate line to be overlapped with the repair line.

7. The organic light-emitting substrate of claim 1, wherein the common electrode is formed to cover a whole surface of the base substrate.

8. The organic light-emitting substrate of claim 7, wherein the organic light-emitting part comprises a material emitting white light.

9. The organic light-emitting substrate of claim 1, wherein the switching transistor comprises:
a switching gate electrode electrically connected to the gate line;
a switching active pattern formed on the switching gate electrode;
a switching source electrode electrically connected to the data line to be overlapped with the switching active pattern; and
a switching drain electrode spaced apart from the switching source electrode to be overlapped with the switching active pattern.

10. The organic light-emitting substrate of claim 1, wherein the driving transistor comprises:
a driving gate electrode electrically connected to the switching drain electrode;
a driving active pattern formed on the driving gate electrode;
a driving source electrode electrically connected to the bias line to be overlapped with the driving active pattern; and
a driving drain electrode spaced apart from the driving source electrode, and overlapped with the driving active pattern to be electrically connected to the pixel electrode.

11. The organic light-emitting substrate of claim 1, further comprising a repair-protruding part protruding from the gate line to be overlapped with the repair line.

12. A method of manufacturing an organic light-emitting substrate, the method comprising:
forming a gate line, a switching gate electrode and a driving gate electrode on a base substrate, the gate line extending along a first direction, the switching gate electrode being electrically connected to the gate line, and the driving gate electrode being spaced apart from the switching gate electrode;
forming an active pattern comprising a switching active pattern disposed on the switching gate electrode, and a driving active pattern disposed on the driving gate electrode;
forming a data metal pattern comprising a data line formed along a second direction crossing the first direction, a bias line spaced apart from the gate line and the data line, a switching source electrode connected to the data line, a switching drain electrode spaced apart from the switching source electrode to be electrically connected to the driving gate electrode, a driving source electrode connected to the bias line and a driving drain electrode spaced apart from the driving source electrode;
forming a pixel metal pattern comprising a pixel electrode electrically connected to the driving drain electrode and a repair line formed of a same material and formed in a same plane as the pixel electrode and insulated from the pixel electrode, the repair line extending along the first direction, the pixel metal pattern further comprising a transistor-covering part to cover the switching transistor, the transistor-covering part and the repair line being formed in one piece and overlapping the switching gate electrode;
forming an organic light-emitting part on the pixel electrode; and
forming a common electrode on the organic light-emitting part,
wherein the gate line and the transistor covering part overlap a channel region which extends between a source region and a drain region of the switching transistor.

13. The method of claim 12, wherein the pixel metal pattern comprises an optically transparent material.

14. An organic light-emitting display device comprising:
an organic light-emitting substrate emitting light; and
an opposite substrate being disposed opposite to the organic light-emitting substrate to protect the organic light-emitting substrate, wherein the organic light-emitting substrate comprises:
a base substrate;
a gate line formed on the base substrate along a first direction;

a data line formed along a second direction crossing the first direction;

a bias line spaced apart from the gate line and the data line;

an organic light-emitting diode comprising a pixel electrode formed on the base substrate, a common electrode formed on the pixel electrode, and an organic light-emitting part formed between the pixel electrode and the common electrode;

a switching transistor electrically connected to the gate line and the data line;

a driving transistor electrically connected to the bias line, the pixel electrode and the switching transistor;

a repair line formed of a same material and formed in a same plane as the pixel electrode and insulated from the pixel electrode, the repair line extending along the first direction; and a transistor-covering part patterned from the pixel metal layer that is used to form the pixel electrode and the repair line to cover the switching transistor, the transistor-covering part and the repair line being formed in one piece, and overlapping a gate electrode of the switching transistor, wherein the gate line and the transistor covering part overlap a channel region which extends between a source region and a drain region of the switching transistor.

15. The organic light-emitting display device of claim 14, wherein the opposite substrate comprises a color filter that is disposed at a position corresponding to the organic-light emitting diode.

16. The organic light-emitting display device of claim 15, wherein the organic light-emitting diode emits white light.

17. The organic light-emitting display device of claim 14, wherein the repair line further comprises two repair points formed at opposite sides of the channel forming region and overlapping the gate line.

* * * * *